(12) United States Patent
Pinkos et al.

(10) Patent No.: US 7,837,585 B2
(45) Date of Patent: Nov. 23, 2010

(54) LINEAR ACTUATOR WITH POSITION SENSING SYSTEM

(75) Inventors: Andrew F. Pinkos, Clarkston, MI (US); Todd M. York, Howell, MI (US); Gary A. Oliveira, Lake Orion, MI (US); Chad R. Umscheid, Waterford, MI (US)

(73) Assignee: American Axle & Manufacturing, Inc., Detroit, MI (US)

( * ) Notice: Subject to any disclaimer, the term of this patent is extended or adjusted under 35 U.S.C. 154(b) by 589 days.

(21) Appl. No.: 11/933,667

(22) Filed: Nov. 1, 2007

(65) Prior Publication Data

US 2008/0122436 A1    May 29, 2008

Related U.S. Application Data

(60) Provisional application No. 60/861,196, filed on Nov. 27, 2006.

(51) Int. Cl.
   *F16H 48/30* (2006.01)
(52) U.S. Cl. ....................................... 475/150
(58) Field of Classification Search .................. 475/150
   See application file for complete search history.

(56) References Cited

U.S. PATENT DOCUMENTS

| | | | |
|---|---|---|---|
| 4,733,101 | A | 3/1988 | Graham et al. |
| 5,593,132 | A | 1/1997 | Hrytzak |
| 5,600,237 | A | 2/1997 | Nippert |
| 5,602,732 | A | 2/1997 | Nichols et al. |
| 5,621,320 | A | 4/1997 | Yokotani et al. |
| 6,109,408 | A | 8/2000 | Ikeda et al. |
| 6,581,748 | B2 | 6/2003 | Streibig et al. |
| 6,769,524 | B2 | 8/2004 | Yasui et al. |
| 6,771,472 | B1 | 8/2004 | Mao et al. |
| 6,958,030 | B2 | 10/2005 | DeGowske |
| 7,211,020 | B2 | 5/2007 | Gohl et al |
| 7,384,359 | B2 | 6/2008 | Pinkos |
| 7,425,185 | B2 | 9/2008 | Donofrio et al. |
| 7,602,271 | B2 * | 10/2009 | York et al. ................... 335/279 |
| 2005/0215394 | A1 | 9/2005 | Bolander et al. |
| 2005/0250613 | A1 | 11/2005 | Ludwig et al. |
| 2005/0277508 | A1 | 12/2005 | DeGowske |
| 2005/0279607 | A1 | 12/2005 | Fusegi |

(Continued)

FOREIGN PATENT DOCUMENTS

EP    1 628 029 A2    2/2006

(Continued)

*Primary Examiner*—Dirk Wright
(74) *Attorney, Agent, or Firm*—Harness, Dickey & Pierce, P.L.C.

(57) ABSTRACT

An electromagnetic actuator assembly with a frame, a movable plunger, first and second sensor targets that are coupled to a plunger for movement therewith, first and second sensors that are coupled to the frame and a controller. The first sensor is configured to sense a position of the first sensor target and to produce a first sensor signal in response thereto. The second sensor is configured to sense a position of the second sensor target and to produce a second sensor signal in response thereto. The controller that receives the first and second sensor signals and identifies three or more discrete points along a path of travel of the plunger. A differential assembly that incorporates the electromagnetic actuator assembly is also provided.

18 Claims, 7 Drawing Sheets

U.S. PATENT DOCUMENTS

| | | |
|---|---|---|
| 2006/0270509 A1 | 11/2006 | Pinkos |
| 2008/0042791 A1 | 2/2008 | York et al. |
| 2008/0182702 A1 | 7/2008 | Donofrio et al. |
| 2009/0011889 A1 | 1/2009 | Haske et al. |
| 2009/0261931 A1* | 10/2009 | York et al. .................. 335/279 |
| 2009/0264243 A1* | 10/2009 | York et al. .................. 475/231 |
| 2010/0013582 A1* | 1/2010 | York et al. .................. 335/261 |

FOREIGN PATENT DOCUMENTS

| | | |
|---|---|---|
| EP | 1 679 219 A1 | 7/2006 |
| EP | 1 726 851 A1 | 11/2006 |
| GB | 2 270 958 A | 3/1994 |
| WO | 2006/053384 A1 | 5/2006 |
| WO | WO 2007/069042 A2 | 6/2007 |

* cited by examiner

LINEAR ACTUATOR WITH POSITION SENSING SYSTEM

CROSS-REFERENCE TO RELATED APPLICATIONS

This application claims the benefit of U.S. Provisional Patent Application Ser. No. 60/861,196 entitled "Linear Actuator With Position Sensing System" filed Nov. 27, 2006.

INTRODUCTION

The present disclosure generally relates to linear actuators, such as a linear actuator that can be employed to selectively lock a locking differential. More particularly, the present disclosure relates to sensing systems for use in determining the state or position of a linear actuator.

U.S. patent application Ser. No. 11/507,311 entitled "Electronically Actuated Apparatus Using Solenoid Actuator With Integrated Sensor" discloses a device that includes an electrically activated solenoid and a sensing system that is integrated with the solenoid for sensing a state or position of a moving component of the solenoid, such as the armature or the plunger. Many of the examples described and illustrated in the '311 patent application employ a single sensor, such as a Hall-effect sensor, to determine a state or position of the moving component of the solenoid. While such configurations are highly desirable as they are both compact and relatively low-cost, we have noted that there are some instances in which additional resolution and/or redundancy would be desirable.

SUMMARY

In one form, the present teachings provide an electromagnetic actuator assembly that includes a frame member, a coil assembly, a plunger, an armature, first and second sensor targets, first and second sensors and a controller. The frame member has an outer sidewall, an inner sidewall and a first end wall that is coupled to the inner and outer sidewalls. The frame member defines an interior annular cavity. The coil assembly is mounted in the annular cavity and includes a core and a coil. The plunger has an annular intermediate wall and a second end wall that extends radially inwardly from the intermediate wall. The intermediate wall is disposed between the coil assembly and the outer sidewall. The armature abuts the plunger. The first and second sensor targets are coupled to the plunger for movement therewith. The first and second sensors are mounted to the frame. The first sensor is configured to sense a position of the first sensor target and to produce a first sensor signal in response thereto. The second sensor is configured to sense a position of the second sensor target and to produce a second sensor signal in response thereto. The controller receives the first and second sensor signals and identifies three or more discrete points along a path of travel of the plunger.

In another form, the present teachings provide a differential assembly with a differential case, a gear set and a locking system. The gear set is received in the differential case and has a pair of side gears and a pair of pinion gears that are meshingly engaged to the side gears. The locking system is configured to selectively lock one of the side gears to the differential case. The locking system includes an electromagnetic actuator assembly with a frame member, a coil assembly, a plunger, an armature, first and second sensor targets, first and second sensors and a controller. The frame member has an outer sidewall, an inner sidewall and a first end wall that is coupled to the inner and outer sidewalls. The frame member defines an interior annular cavity. The coil assembly is mounted in the annular cavity and includes a core and a coil. The plunger has an annular intermediate wall and a second end wall that extends radially inwardly from the intermediate wall. The intermediate wall is disposed between the coil assembly and the outer sidewall. The armature abuts the plunger. The first and second sensor targets are coupled to the plunger for movement therewith. The first and second sensors are mounted to the frame. The first sensor is configured to sense a position of the first sensor target and to produce a first sensor signal in response thereto. The second sensor is configured to sense a position of the second sensor target and to produce a second sensor signal in response thereto. The controller receives the first and second sensor signals and identifies three or more discrete points along a path of travel of the plunger.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION OF THE VARIOUS EMBODIMENTS

Figure 1:
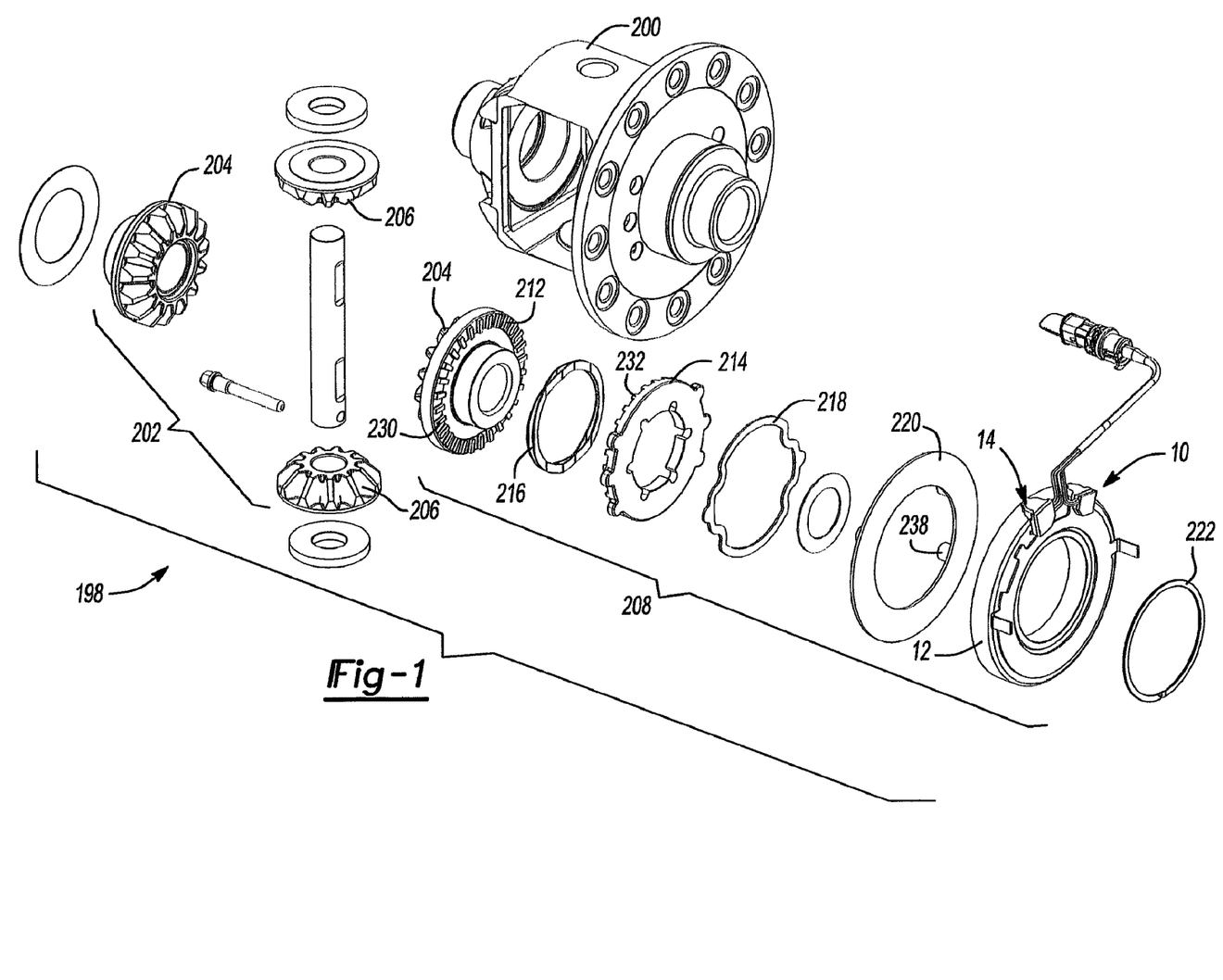
FIG. 1 is an exploded perspective view of an actuating device constructed in accordance with the teachings of the present disclosure, the actuating device being associated with a locking mechanism of an electronic locking differential.
Figure 2:
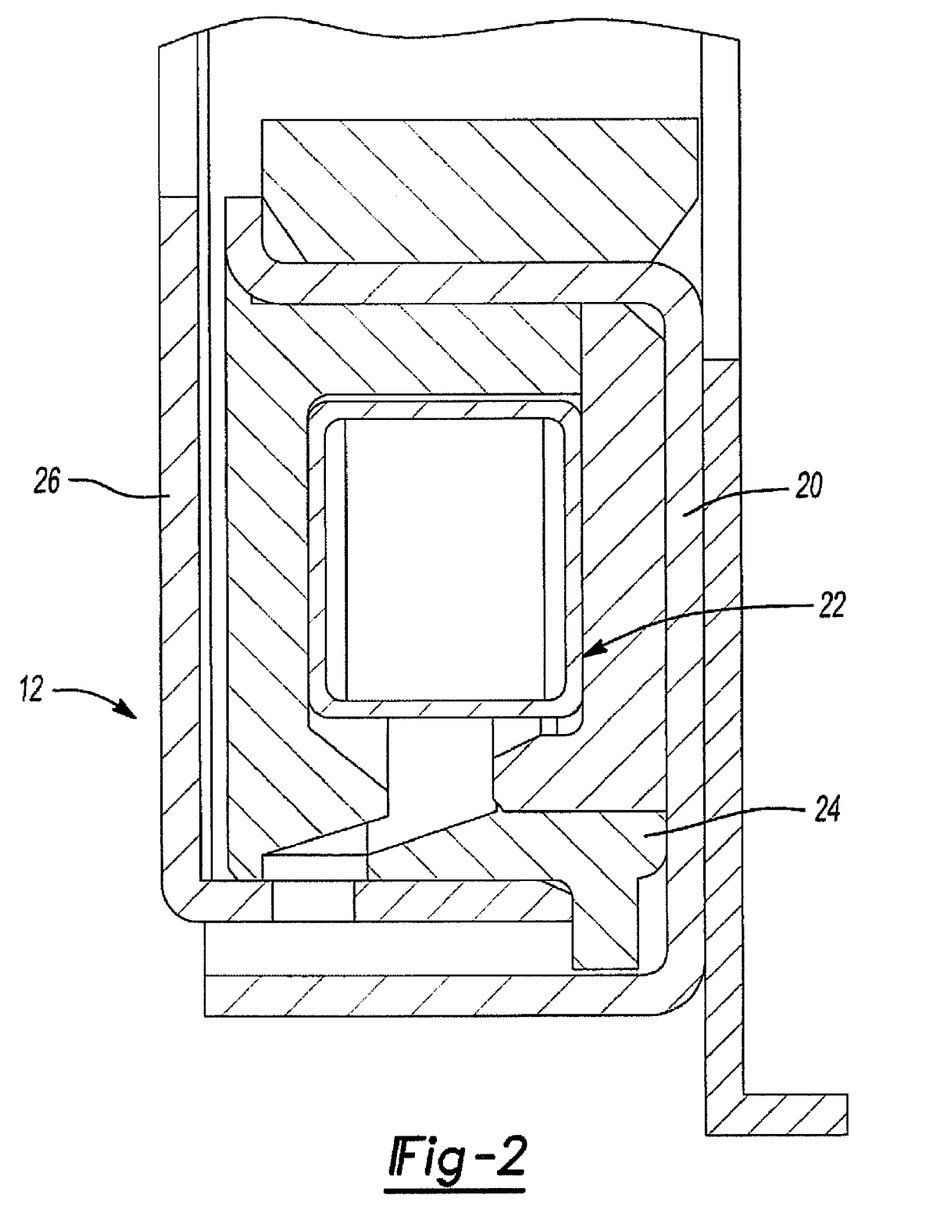
FIG. 2 is a cross-sectional view of a portion of the actuating device of FIG. 1.

With reference to FIGS. 1 and 2 of the drawings, an actuating device constructed in accordance with the teachings of the present invention is generally indicated by reference numeral 10. The actuating device 10 can include a solenoid 12 and a sensing system 14. The solenoid 12 can be constructed in a manner that is similar to that which is described in U.S. patent application Ser. No. 11/507,311 entitled "Electronically Actuated Apparatus Using Solenoid Actuator With Integrated Sensor", filed Aug. 21, 2006, the disclosure of which is hereby incorporated by reference as if fully set forth in detail herein. Briefly, the solenoid 12 can include a frame 20, a coil assembly 22, an armature 24 and a plunger 26. The coil assembly 22 can be selectively activated to generate a magnetic field that can repel the armature 24 away from the coil assembly 22 to thereby translate the plunger 26.

In the particular example provided, the actuating device 10 is associated with an electronically locking differential 198 of the type that is disclosed in the '311 patent application. Briefly, the differential 198 can include a differential case 200, a gear set 202, which can include a pair of side gears 204 and a pair of pinion gears 206, and a locking system 208. The gear set 202 can be mounted in the differential case 200 such that the pinion gears 206 meshingly engage the side gears 204. The locking system 208 can include a first dog ring 212, which can be integrally formed with one of the side gears 204, a second dog ring 214, which can be non-rotatably but axially movably mounted in the differential case 200, a return spring 216, a spacer ring 218, a thrust plate 220, the solenoid 12 and a retaining ring 222. The first dog ring 212 can include teeth 230 that can be meshingly engaged to teeth 232 on the second dog ring 214. The return spring 216 can bias the second dog ring 214 away from the first dog ring 212 so that the teeth 230 and 232 are not engaged to one another. The spacer ring 218 can be disposed between the differential case 200 and the second dog ring 214. The thrust plate 220, the solenoid 12 and the retaining ring 222 can be mounted on the differential case 200; the retaining ring 222 can inhibit the removal of the thrust plate 220 and the solenoid 12 from the differential case 200. The solenoid 12 can be operated to drive the thrust plate 220 away from the retaining ring 222 so that legs 238 formed on the thrust plate 220 move the spacer ring 218 (and consequently the second dog ring 214) toward the first dog ring 212 to cause the teeth 232 of the second dog ring 214 to meshingly engage the teeth 230 of the first dog ring 212 to thereby lock the differential 198.

Figures 3, 4:
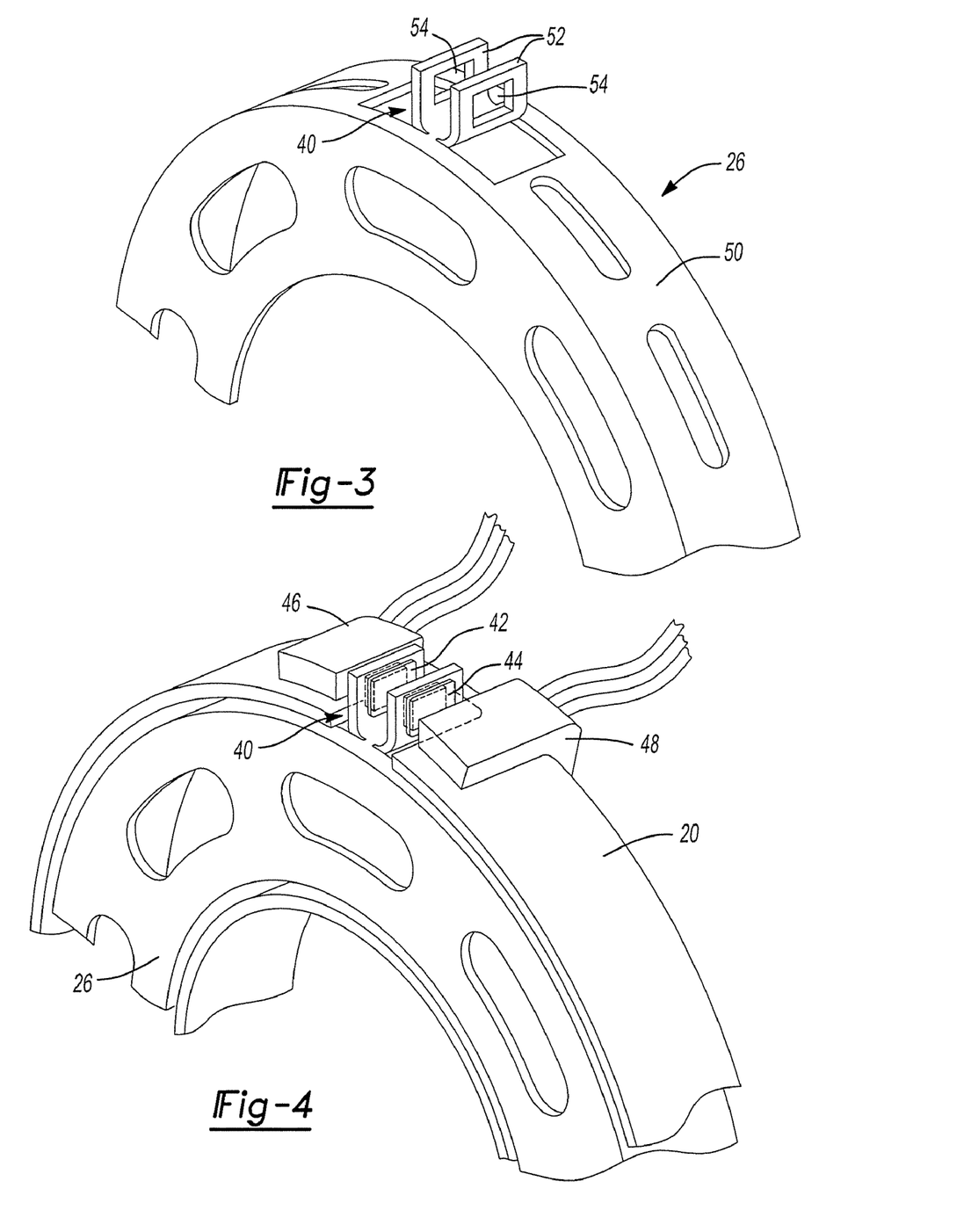
FIG. 3 is a perspective view of a portion of the actuating device of FIG. 1 illustrating the plunger of the solenoid in more detail.
FIG. 4 is a perspective view of a portion of the actuating device of FIG. 1.

With reference to FIGS. 1, 3 and 4, the sensing system 14 can include a target mount 40, a first target 42, a second target 44, a first sensor 46 and a second sensor 48. The target mount 40 can be coupled to or integrally formed with a moving component of the solenoid 12, such as the plunger 26. In the particular example provided, the target mount 40 is formed in the side wall or rim member 50 of the plunger 26 and can comprise one or more tabs 52 that can be sheared and bent outwardly from the rim member 50. Each tab 52 can define one or more apertures 54 into which the first and second sensor targets 42 and 44 can be received. The first and second sensor targets 42 and 44 can be coupled to the tab(s) 52 in any appropriate manner, including brazing and adhesives. The first and second sensors 46 and 48 can be any appropriate type of sensor, such as Hall-effect sensors (e.g., a programmable A1182 sensor marketed by Allegro MicroSystems, Inc. of Worchester, Mass.). The first and second sensors 46 and 48 can be mounted to a stationary portion of the solenoid 12, such as the frame 20. The first and second sensors 46 and 48 are disposed on opposite sides of the target mount 40, but it will be appreciated that the first and second sensors 46 and 48 could be mounted on the same side of the target mount 40. In the particular example provided, the first and second sensor targets 42 and 44 are positioned such that they are radially offset from one another relative to a centerline of the solenoid 12. It will be appreciated that the first and second sensors 46 and 48 are also positioned in a radially offset manner that corresponds to that of the first and second sensor targets 42 and 44, respectively.

Figure 5:
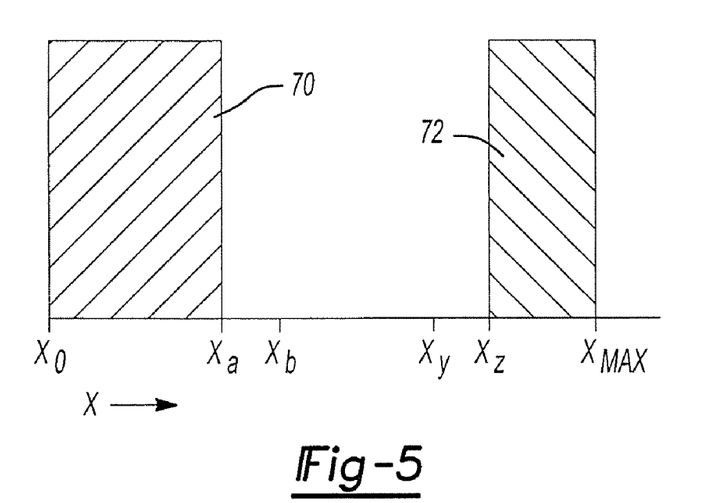
FIG. 5 is a plot showing an engaged or disengaged condition of a family of electronic locking differential assemblies as a function of the distance with which a plunger has traveled.

A plot illustrating a condition of a locking mechanism for a family of electronic locking differential assemblies as a function of a position (x) of the plunger 26 (FIG. 3) is shown in FIG. 5. The electronic locking differential assemblies can be of the type that is illustrated and described in the aforementioned patent application and their components are selected to either maximize or minimize the magnitude of the position (x) at which a change in the state of the electronic locking differential occurs. For example, one set of components can be selected such that the magnitude of the positions at which the electronic locking differential transitions out of a completely disengaged condition (i.e., position $x_a$) and into a completely engaged condition (i.e., position $x_y$) are relatively small, while another set of components can be selected such that the magnitude of the positions at which the electric locking differential transitions out of a completely disengaged condition (i.e., position $x_b$) and into a completely engaged condition (i.e., position $x_z$) are relatively large. Those of skill in the art will appreciate that the components are "in tolerance" components and are selected to establish the end points of a first range of positions 70 in which all members of the family of electronic locking differential will be in a completely disengaged condition, as well as the end points of a second range of positions 72 in which all members of the family of electronic locking differentials will be in a completely engaged condition. The components that can be employed to establish the end points of the first and second ranges 70 and 72 can be selected on the basis of extremes in tolerance ranges (e.g., maximum material condition or minimum material condition; extremes of the tolerances for flatness, parallelness and runout).

Figure 6:
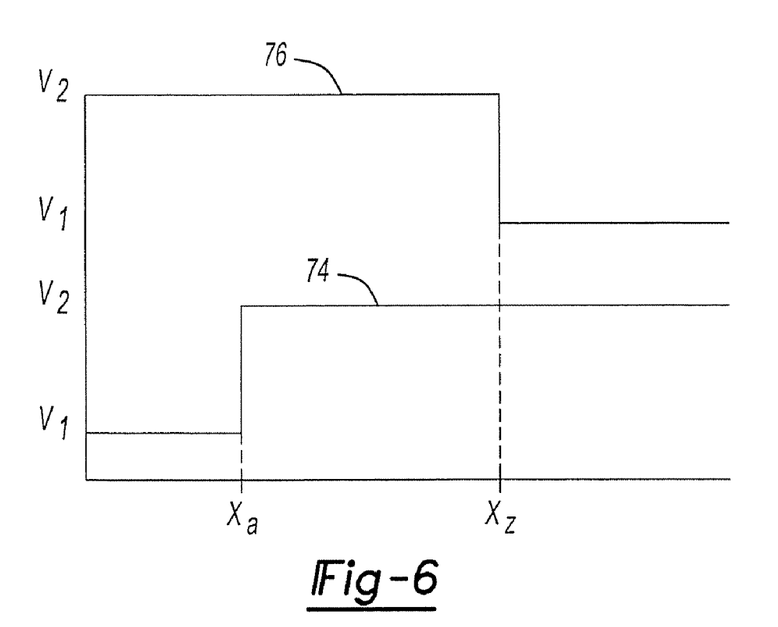
FIG. 6 is a plot illustrating the output of the sensing system as a function of the distance with which the plunger has traveled.

Given the data of FIG. 5, the first and second sensors 46 and 48 of FIG. 4 can be programmed to produce the output that is illustrated in FIG. 6. The plot 74 illustrates the output of the first sensor 46 (FIG. 4) and as shown, transitions from a first signal (e.g., voltage) at position $x_a$ to a second signal (e.g., voltage) that is maintained as the position (x) increases in magnitude. Similarly, the plot 76 illustrates the output of the second sensor 48 (FIG. 4) and as shown, transitions from a second signal (e.g., voltage) at position $x_z$ to a first signal (e.g., voltage) that is maintained as the position (x) increases in magnitude. It will be appreciated that with the first and second sensors 46 and 48 (FIG. 4) thus calibrated, it is possible to identify when an electronic locking differential assembly is operating in a disengaged state and an engaged state without calibrating the first and second sensors 46 and 48 (FIG. 4) to a given family member (i.e., without calibrating to a given combination or specific set of in-tolerance components).

Figure 7:
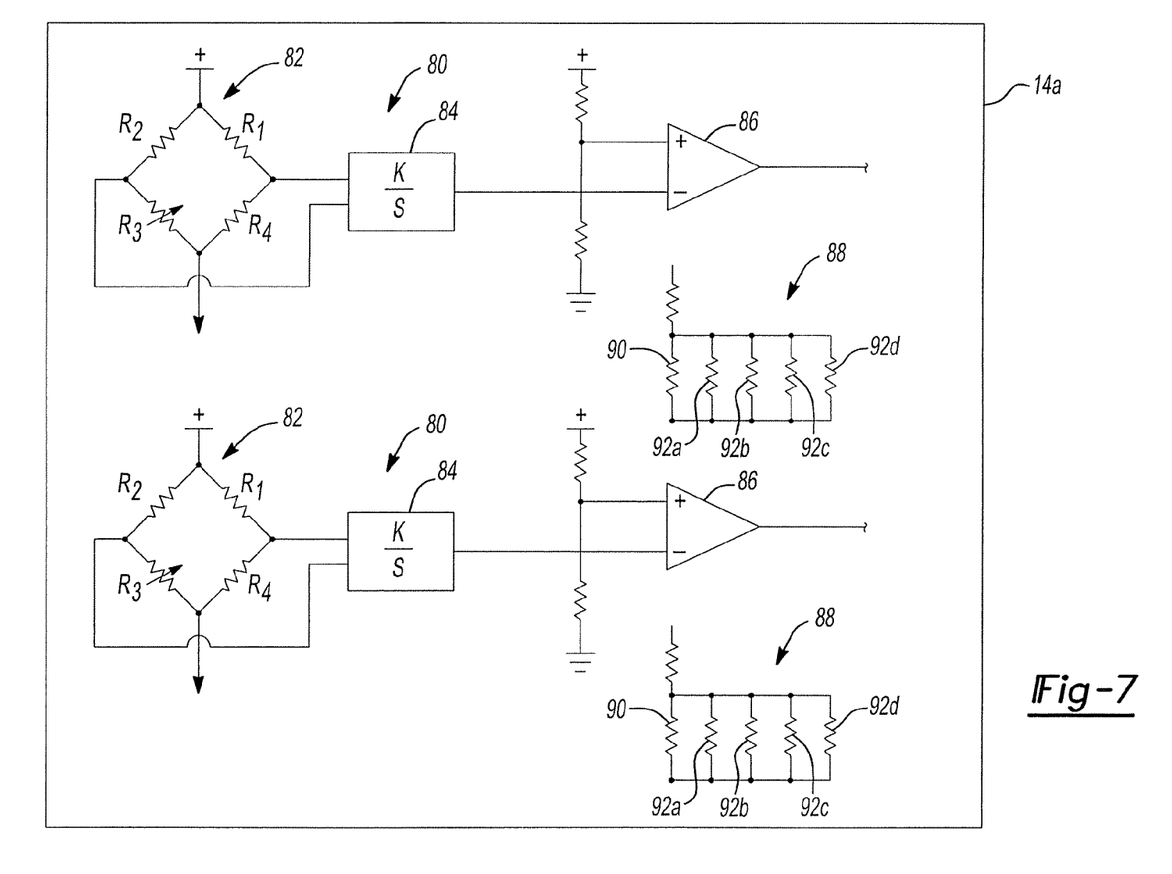
FIGS. 7 through 9 are schematic illustrations of other sensing systems constructed in accordance with the teachings of the present disclosure.

While the sensing system 14 has been illustrated and described thus far as including one or more Hall-effect sensors, it will be appreciated that the invention, in its broadest aspects, can be constructed somewhat differently. For example, the sensing system 14a can include one or more magneto-resistive sensors as shown in FIG. 7. Each portion 80 of the sensing system 14a that is associated with a corresponding one of the magneto-resistive sensors R4 can further include a Wheatstone bridge 82, a low-pass filter 84 and a comparator 86.

The Wheatstone bridge 82 can include a first resistor R1, a second resistor R2, a third resistor R3 and an associated one of the magneto-resistive sensors R4. As will be appreciated by those of skill in the art, the resistance of the magneto-resistive sensor R4 will vary based on the position of the magneto-resistive sensor R4 relative to a magnetic target that can be associated with the plunger 26 (FIG. 2). The output of the Wheatstone bridge 82 can be processed through the low-pass filter 84 and input to the comparator 86, which can compare the output to one or more control signals that can be produced by a resistor bank 88, which can include a thermistor 90 and one or more resistors, such as resistors 92a, 92b, 92c and 92d. The thermistor 90 can be in close thermal proximity to the solenoid 12 (FIG. 1) and as such, can output a signal that is indicative of a temperature of the solenoid 12 (FIG. 1). The resistors 92a, 92b, 92c and 92d can be employed to identify discrete points along the path that the plunger 26 can travel. For example, if the sensing system 14a is part of an actuating device that is employed in a locking differential assembly of the type described above, the resistors 92a, 92b, 92c and 92d can be associated with points at which the locking system is always disengaged. It will be appreciated that the other portion of the sensing system 14 can be similarly configured and that the resistors of a resistor bank associated with its comparator can be associated with points at which the locking system is always engaged. It will further be appreciated that the sensing system could comprise a single magneto-resistive sensor and could employ a comparator with a resistor bank having one or more resistors that are associated with points at which the locking system is always disengaged and one or more resistors that are associated with points at which the locking system is always engaged. The comparator 86 can output a signal that can be indicative of a position of the plunger.

Figure 8:
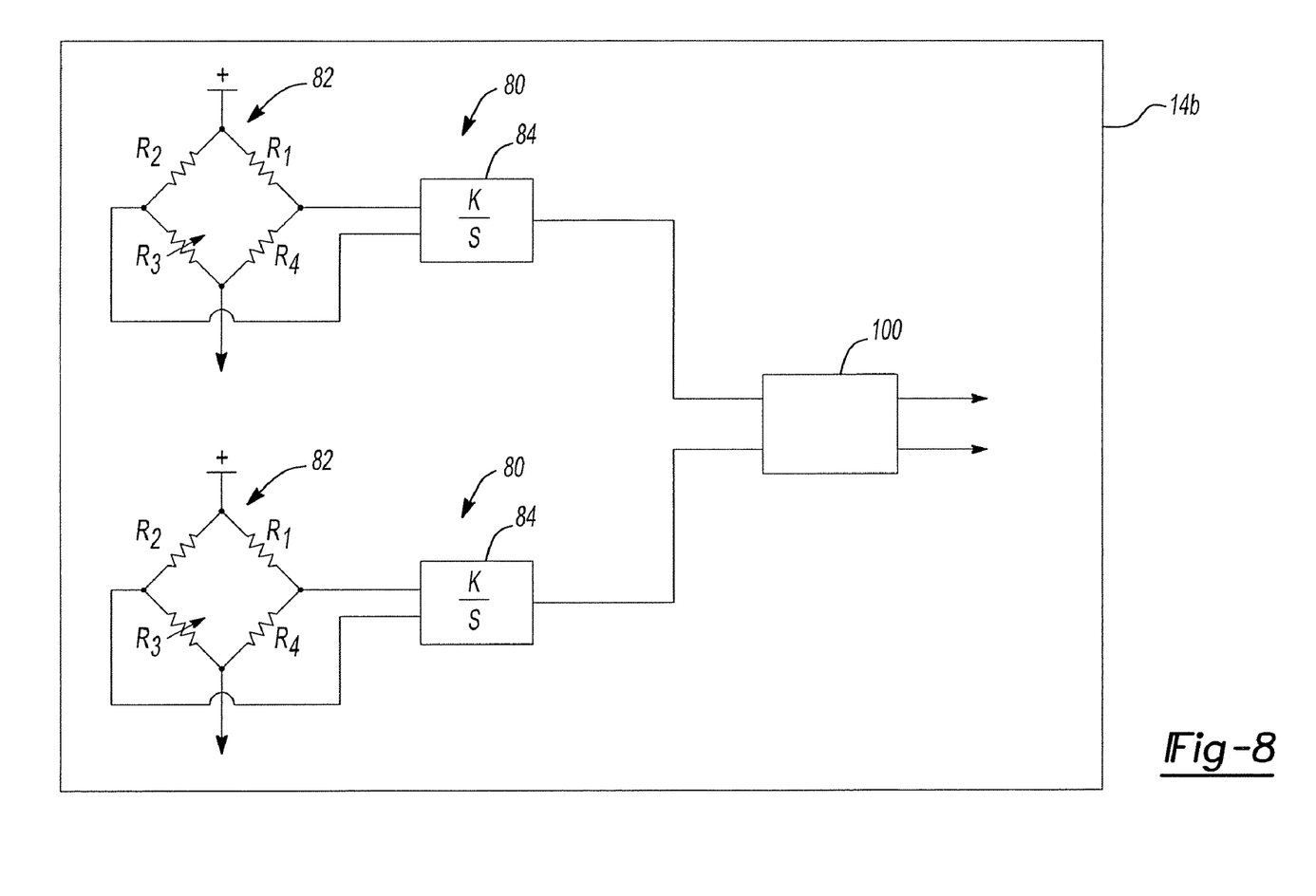

The switching system 14b of FIG. 8 is generally similar to the switching system 14a of FIG. 7, except that a controller or microprocessor 100 has been substituted for the comparators 86 and the resistor banks 88. In this regard, the functions of the comparators 86 and the resistor banks 88 are performed by the microprocessor 100 and the microprocessor 100 can output signals that are indicative of a position of the plunger.

Figure 9:
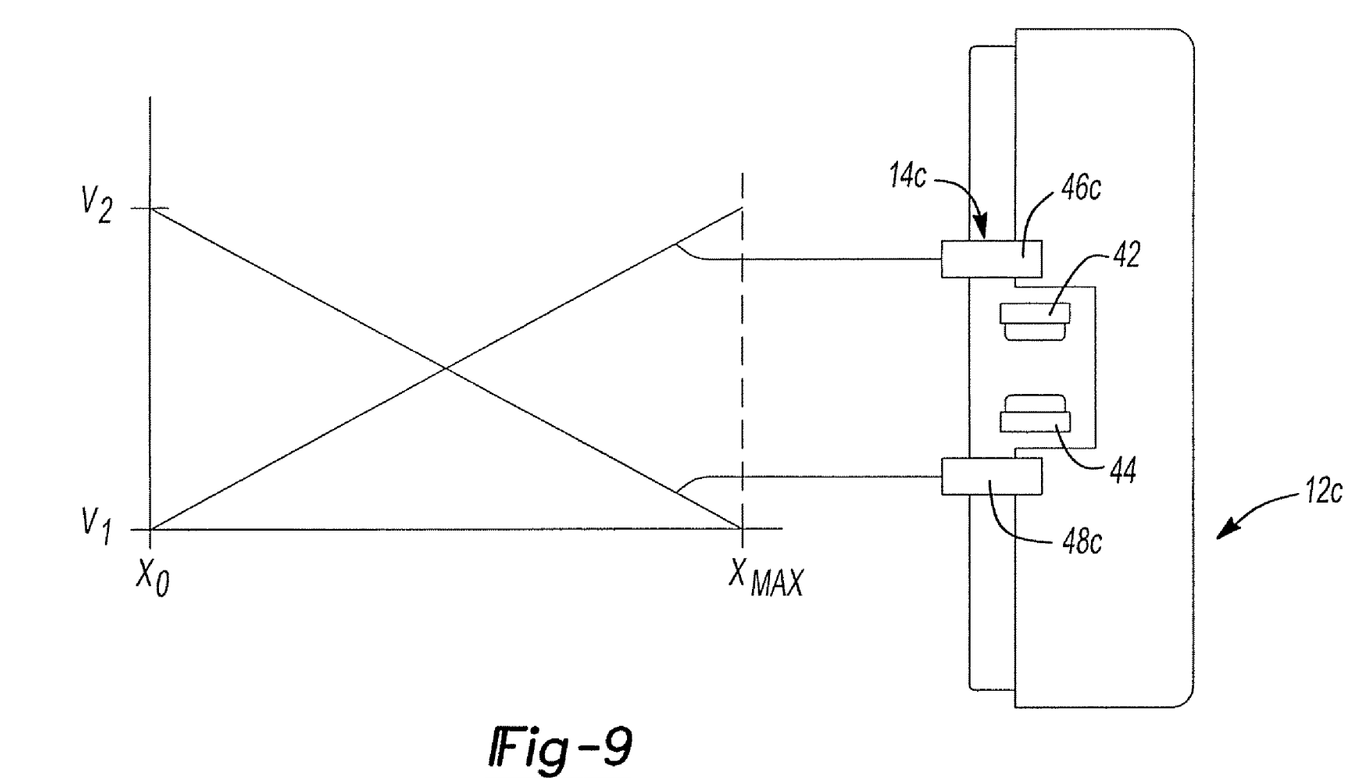

In the example of FIG. 9, the sensing system 14c can be generally similar to the sensing system 14a and 14b of FIGS. 7 and 8, respectively, except that the first and second sensors 46c and 48c can be configured with reverse polarity (i.e., the signal output from the first sensor 46c is the inverse of the signal that is output from the second sensor 48c). Configuration in this manner provides opportunities for fault detection (e.g., short-to-ground condition or short-to-voltage input condition). Additionally the first and second sensors 46c and 48c can be commercially available magnetoresistive sensors that can be configured to sense a change in an angle of an applied magnetic field. In the example provided, the solenoid 12c has a relatively short stroke and consequently, the first and second sensors 46c and 48c can be employed to accurately approximate the linear distance that the first and second targets 42 and 44, respectively, travel.

While specific examples have been described in the specification and illustrated in the drawings, it will be understood by those of ordinary skill in the art that various changes may be made and equivalents may be substituted for elements thereof without departing from the scope of the present disclosure as defined in the claims. Furthermore, the mixing and matching of features, elements and/or functions between various examples is expressly contemplated herein so that one of ordinary skill in the art would appreciate from this disclosure that features, elements and/or functions of one example may be incorporated into another example as appropriate, unless described otherwise, above. Moreover, many modifications may be made to adapt a particular situation or material to the teachings of the present disclosure without departing from the essential scope thereof. Therefore, it is intended that the present disclosure not be limited to the particular examples illustrated by the drawings and described in the specification as the best mode presently contemplated for carrying out the teachings of the present disclosure, but that the scope of the present disclosure will include any embodiments falling within the foregoing description and the appended claims.

What is claimed is:

1. An electromagnetic actuator assembly comprising:
a frame member having an outer sidewall, an inner sidewall and a first end wall that is coupled to the inner and outer sidewalls, the frame member defining an interior annular cavity;
a coil assembly mounted in the annular cavity, the coil assembly including a core and a coil;
a plunger having an annular intermediate wall and a second end wall that extends radially inwardly from the intermediate wall, the intermediate wall being disposed between the coil assembly and the outer sidewall;
an armature that abuts the plunger;
first and second sensor targets coupled to the plunger for movement therewith;
first and second sensors mounted to the frame, the first sensor being configured to sense a position of the first sensor target and to produce a first sensor signal in response thereto, the second sensor being configured to sense a position of the second sensor target and to produce a second sensor signal in response thereto; and
a controller that receives the first and second sensor signals and identifies three or more discrete points along a path of travel of the plunger.

2. The electromagnetic actuator assembly of claim 1, wherein the first sensor target is mounted parallel to and circumferentially spaced from the second sensor target and wherein the first and second sensors are circumferentially spaced from the first and second sensor targets, respectfully.

3. The electromagnetic actuator assembly of claim 2, wherein the first and second sensors are magnetoresistive sensors.

4. The electromagnetic actuator assembly of claim 1, wherein the first sensor has a polarity that is opposite a polarity of the second sensor.

5. The electromagnetic actuator assembly of claim 1, wherein the controller includes a first resistor bank, a first comparator, a second resistor bank and a second comparator, wherein the first comparator compares the first sensor signal to an output of the first resistor bank and wherein the second comparator compares the second sensor signal to an output of the second resistor bank.

6. The electromagnetic actuator assembly of claim 5, wherein the controller further includes a temperature sensor for sensing a temperature of the electromagnetic actuator assembly.

7. The electromagnetic actuator assembly of claim 1, wherein the controller includes a microprocessor for determining a position of the plunger based on the first and second sensor signals.

8. The electromagnetic actuator assembly of claim 1, wherein the first sensor is configured to sense an angular position of the first sensor target.

9. A differential assembly comprising:
a differential case;
a gear set received in the differential case and having a pair of side gears and a pair of pinion gears that are meshingly engaged to the side gears; and
a locking system for locking one of the side gears to the differential case, the locking system including an electromagnetic actuator assembly with a frame member, a coil assembly, a plunger, an armature, first and second sensor targets, first and second sensors and a controller, the frame member having an outer sidewall, an inner sidewall and a first end wall that is coupled to the inner and outer sidewalls, the frame member defining an interior annular cavity, the coil assembly being mounted in the annular cavity and including a core and a coil, the plunger having an annular intermediate wall and a second end wall that extends radially inwardly from the intermediate wall, the intermediate wall being disposed between the coil assembly and the outer sidewall, the armature abutting the plunger, the first and second sensor targets being coupled to the plunger for movement therewith, the first and second sensors being mounted to the frame, the first sensor being configured to sense a position of the first sensor target and to produce a first sensor signal in response thereto, the second sensor being configured to sense a position of the second sensor target and to produce a second sensor signal in response thereto, the controller receiving the first and second sensor signals and identifying three or more discrete points along a path of travel of the plunger.

10. The differential assembly of claim 9, wherein the locking system further includes a first dog ring, a second dog ring, a return spring, and a thrust plate, the first dog ring being coupled to one of the side gears, the second dog ring being non-rotatably but axially-movably received in the differential case, the return spring biasing the second dog ring apart from the first dog ring, the thrust plate and the electromagnetic actuator assembly being mounted on the differential case, the electromagnetic actuator assembly being selectively actuatable to move the thrust plate to cause the second dog ring to non-rotatably engage the first dog ring.

11. The differential assembly of claim 9, wherein the first sensor target is mounted parallel to and circumferentially spaced from the second sensor target and wherein the first and second sensors are circumferentially spaced from the first and second sensor targets, respectfully.

12. The differential assembly of claim 11, wherein the first and second sensors are magnetoresistive sensors.

13. The differential assembly of claim 9, wherein the first sensor has a polarity that is opposite a polarity of the second sensor.

14. The differential assembly of claim 9, wherein the controller includes a first resistor bank, a first comparator, a second resistor bank and a second comparator, wherein the first comparator compares the first sensor signal to an output of the first resistor bank and wherein the second comparator compares the second sensor signal to an output of the second resistor bank.

15. The differential assembly of claim 14, wherein the controller further includes a temperature sensor for sensing a temperature of the electromagnetic actuator assembly.

16. The differential assembly of claim 9, wherein the controller includes a microprocessor for determining a position of the plunger based on the first and second sensor signals.

17. The differential assembly of claim 9, wherein the first sensor is configured to sense an angular position of the first sensor target.

18. A differential assembly comprising:
a differential case;
a gear set received in the differential case and having a pair of side gears and a pair of pinion gears that are meshingly engaged to the side gears; and
a locking system for locking one of the side gears to the differential case, the locking system including a first dog ring, a second dog ring, a return spring, and a thrust plate and an electromagnetic actuator assembly, the first dog ring being coupled to one of the side gears, the second dog ring being non-rotatably but axially-movably received in the differential case, the return spring biasing the second dog ring apart from the first dog ring, the thrust plate and the electromagnetic actuator assembly being mounted on the differential case, the electromagnetic actuator assembly being selectively actuatable to move the thrust plate to cause the second dog ring to non-rotatably engage the first dog ring, the electromagnetic actuator assembly including a frame member, a coil assembly, a plunger, an armature, first and second sensor targets, first and second sensors and a controller, the frame member having an outer sidewall, an inner sidewall and a first end wall that is coupled to the inner and outer sidewalls, the frame member defining an interior annular cavity, the coil assembly being mounted in the annular cavity and including a core and a coil, the plunger having an annular intermediate wall and a second end wall that extends radially inwardly from the intermediate wall, the intermediate wall being disposed between the coil assembly and the outer sidewall, the armature abutting the plunger, the first and second sensor targets being coupled to the plunger for movement therewith, the first and second sensors being mounted to the frame, the first sensor being configured to sense a position of the first sensor target and to produce a first sensor signal in response thereto, the second sensor being configured to sense a position of the second sensor target and to produce a second sensor signal in response thereto, the controller receiving the first and second sensor signals and identifying three or more discrete points along a path of travel of the plunger;
wherein the first sensor target is mounted parallel to and circumferentially spaced from the second sensor target and wherein the first and second sensors are circumferentially spaced from the first and second sensor targets, respectfully.
wherein the first and second sensors are magnetoresistive sensors;
wherein the first sensor has a polarity that is opposite a polarity of the second sensor;
wherein the controller includes a first resistor bank, a first comparator, a second resistor bank and a second comparator, wherein the first comparator compares the first sensor signal to an output of the first resistor bank and wherein the second comparator compares the second sensor signal to an output of the second resistor bank;
wherein the controller further includes a temperature sensor for sensing a temperature of the electromagnetic actuator assembly; and
wherein the first sensor is configured to sense an angular position of the first sensor target.

* * * * *